(12) United States Patent
Stark

(10) Patent No.: US 7,148,699 B1
(45) Date of Patent: Dec. 12, 2006

(54) TECHNIQUE FOR CALIBRATING ELECTRONIC DEVICES

(75) Inventor: Donald C. Stark, Los Altos Hills, CA (US)

(73) Assignee: Rambus Inc., Los Altos, CA (US)

( * ) Notice: Subject to any disclaimer, the term of this patent is extended or adjusted under 35 U.S.C. 154(b) by 308 days.

(21) Appl. No.: 10/298,541

(22) Filed: Nov. 19, 2002

Related U.S. Application Data (60) Provisional application No. 60/390,442, filed on Jun. 24, 2002.

(51) Int. Cl.
*G01R 35/00* (2006.01)

(52) U.S. Cl. ..................................... 324/601

(58) Field of Classification Search ............... 324/601; 323/280, 312, 313; 327/72, 535
See application file for complete search history.

(56) References Cited

U.S. PATENT DOCUMENTS

| | | | |
|---|---|---|---|
| 5,742,798 A | 4/1998 | Goldrian ..................... 713/400 |
| 6,069,828 A * | 5/2000 | Kaneko et al. ........ 365/189.09 |
| 6,127,881 A * | 10/2000 | Tsay et al. .................. 327/538 |
| 6,617,888 B1 * | 9/2003 | Volk ........................... 327/67 |
| 6,636,081 B1 * | 10/2003 | Lee ............................. 327/72 |
| 6,713,996 B1 * | 3/2004 | Di Iorio ..................... 323/313 |

FOREIGN PATENT DOCUMENTS

JP 2000-35831 2/2000

\* cited by examiner

*Primary Examiner*—Anjan Deb
*Assistant Examiner*—John Teresinski
(74) *Attorney, Agent, or Firm*—Hunton & Williams LLP (57) ABSTRACT

A technique for calibrating a second electronic device using a first electronic device having a reference characteristic is disclosed. In one particular exemplary embodiment, the technique may be realized as a method for calibrating a second electronic device using a first electronic device, wherein the first electronic device has a reference characteristic, wherein the second electronic device has an adjustable element, and wherein the first electronic device and the second electronic device are interconnected via one or more signal lines. The method comprises generating a first value based at least in part upon the reference characteristic, and providing the first value to the second electronic device via one of the one or more signal lines. The method also comprises generating a second value, based at least in part upon the first value, using the adjustable element. The method further comprises comparing the second value to the first value, and adjusting the adjustable element so as to modify the second value until the second value substantially matches the first value.

30 Claims, 9 Drawing Sheets

TECHNIQUE FOR CALIBRATING ELECTRONIC DEVICES

CROSS-REFERENCE TO RELATED APPLICATIONS

This patent application claims priority to U.S. Provisional Patent Application No. 60/390,442, filed Jun. 24, 2002, which is hereby incorporated by reference herein in its entirety.

FIELD OF THE INVENTION

The present invention relates generally to the calibration of input/output characteristics of electronic devices and, more particularly, to a technique for calibrating a second electronic device using a first electronic device having a reference characteristic.

BACKGROUND OF THE INVENTION

Electronic output transmitters generally operate in either a voltage mode, driving a constant voltage, or a current mode, driving a constant current. As switching frequencies increase, it becomes increasingly important that the characteristics associated with these modes be well controlled in order to minimize adverse interactions in a transmission line environment. At some point, process, voltage, and temperature (PVT) variations make it impossible to statically control the output characteristics of an output transmitter. To improve the output characteristics of an output transmitter beyond this point, it is necessary to calibrate the output transmitter after it is placed into a system environment.

Similarly, transmission line termination means are also subject to PVT variations. As such, the transmission line termination means must be calibrated within a system environment for maximum performance.

Calibration of voltage (V), current (I), and/or resistance (R) for output transmitters or transmission line termination means may be accomplished using known values for V, I, and/or R and some comparison logic. However, there is some difficulty in generating, distributing, and applying the known values to a device being calibrated, while optimizing cost and ease-of-use. For example, applying a reference V and a reference R to calibrate output transmitters operating in current mode requires a resistor and a calibration pin for each output transmitter (or group of output transmitters). This imposes an unacceptable cost and complexity burden on electronic devices such as, for example, memory modules with multiple DRAM devices.

Existing calibration techniques require dedicated external resources in the form of V, I, and/or R sources, along with dedicated pathways (i.e., integrated circuit contacts) to apply them to an electronic device. For systems having many electronic devices, such as, for example, DRAM memory systems, or where calibration precision requires output transmitters and/or transmission line termination means to be calibrated either individually or in small groups, this imposes a large cost and complexity burden upon both the electronic devices and the system.

Existing calibration techniques are typically only performed on systems having few high speed electronic devices. Because of the small number of these electronic devices being calibrated, adding additional components to enable calibration is acceptable, and cost is not a primary design constraint. However, for systems with many data paths and many electronic devices that require calibration, another more cost effective method of calibration is required, reusing existing system elements where possible.

In view of the foregoing, it would be desirable to provide a technique for calibrating electronic devices which overcomes the above-described inadequacies and shortcomings in an efficient and cost effective manner.

SUMMARY OF THE INVENTION

According to the present invention, a technique for calibrating a second electronic device using a first electronic device having a reference characteristic is provided. In one particular exemplary embodiment, the technique may be realized as a method for calibrating a second electronic device using a first electronic device, wherein the first electronic device has a reference characteristic, wherein the second electronic device has an adjustable element, and wherein the first electronic device and the second electronic device are interconnected via one or more signal lines. The method comprises generating a first value based at least in part upon the reference characteristic, and providing the first value to the second electronic device via one of the one or more signal lines. The method also comprises generating a second value, based at least in part upon the first value, using the adjustable element. The method further comprises comparing the second value to the first value, and adjusting the adjustable element so as to modify the second value until the second value substantially matches the first value.

In accordance with other aspects of this particular exemplary embodiment of the present invention, the first electronic device and the second electronic device may beneficially have similar input/output structures which are interconnected via at least one of the one or more signal lines. Also, the one or more signal lines, which may include one or more interdevice communication signal lines, typically beneficially carry digital signals between the first electronic device and the second electronic device after the second electronic device is calibrated.

In accordance with further aspects of this particular exemplary embodiment of the present invention, the reference characteristic may beneficially be a reference voltage source, the first value may beneficially be a reference voltage value, and the second value may beneficially be a calibration voltage value. If such is the case, the adjustable element may beneficially comprise an adjustable voltage source. Alternatively, the adjustable element may beneficially comprise an adjustable current source and the method may further beneficially comprise providing a resistive element, wherein the adjustable current source is coupled to the resistive element. If such is the case, the resistive element may beneficially have a resistance value which is fixed when generating the second value. Alternatively still, the adjustable element may beneficially comprise an adjustable resistive element and the method may further beneficially comprise providing a current source, wherein the adjustable resistive element is coupled to the current source. If such is the case, the current source may beneficially have a current value which is fixed when generating the second value.

In accordance with further aspects of this particular exemplary embodiment of the present invention, the reference characteristic may beneficially be a reference current source having a reference current value, the first value may beneficially be a reference voltage value, the second value may beneficially be a calibration voltage value, and the reference voltage value may beneficially be generated by passing a current associated with the reference current value through a resistive element. The resistive element may beneficially be located at the first electronic device, the second electronic device, or elsewhere. Also, the resistive element may beneficially have a resistance value which is fixed when generating the second value. Further, the adjustable element may beneficially comprise an adjustable voltage source. Alternatively, the adjustable element may beneficially comprise an adjustable current source and the method may further beneficially comprise providing a resistive element, wherein the adjustable current source is coupled to the resistive element. If such is the case, the resistive element may beneficially have a resistance value which is fixed when generating the second value. Alternatively still, the adjustable element may beneficially comprise an adjustable resistive element and the method may further beneficially comprise providing a current source, wherein the adjustable resistive element is coupled to the current source. If such is the case, the current source may beneficially have a current value which is fixed when generating the second value.

In accordance with still further aspects of this particular exemplary embodiment of the present invention, the reference characteristic may beneficially be a reference resistive element having a reference resistance value, the first value may beneficially be a reference voltage value, the second value may beneficially be a calibration voltage value, and the reference voltage value may beneficially be generated by passing a current associated with a current source through the reference resistive element. The current source may beneficially be located at the first electronic device, the second electronic device, or elsewhere. Also, the current source may beneficially have a current value which is fixed when generating the second value. Further, the adjustable element may beneficially comprise an adjustable voltage source. Alternatively, the adjustable element may beneficially comprise an adjustable current source and the method may further beneficially comprise providing a resistive element, wherein the adjustable current source is coupled to the resistive element. If such is the case, the resistive element may beneficially have a resistance value which is fixed when generating the second value. Alternatively still, the adjustable element may beneficially comprise an adjustable resistive element and the method may further beneficially comprise providing a current source, wherein the adjustable resistive element is coupled to the current source. If such is the case, the current source may beneficially have a current value which is fixed when generating the second value.

In accordance with additional aspects of this particular exemplary embodiment of the present invention, the first electronic device has a second reference characteristic, and the second electronic device has a second adjustable element. The method may further beneficially comprise generating a third value based at least in part upon the second reference characteristic, and providing the third value to the second electronic device via a second one of the one or more of signal lines. The method may still further beneficially comprise generating a fourth value, based at least in part upon the third value, using the second adjustable element, comparing the fourth value to the third value, and adjusting the second adjustable element so as to modify the fourth value until the fourth value substantially matches the third value.

In accordance with still additional aspects of this particular exemplary embodiment of the present invention, providing the first value to the second electronic device via one of the one or more of signal lines may beneficially comprise transmitting the first value from the first electronic device to the second electronic device via one of the one or more of signal lines.

In another particular exemplary embodiment, the technique may be realized as a method for calibrating a second electronic device using a first electronic device, wherein the first electronic device has a first reference characteristic and a second reference characteristic, wherein the second reference characteristic has an associated second value, wherein the second electronic device has an adjustable element, and wherein the first electronic device and the second electronic device are interconnected via a plurality of signal lines. The method of the present embodiment comprises generating a first value based at least in part upon the first reference characteristic, providing the first value to the second electronic device via a first of the plurality of signal lines, and providing the second value to the second electronic device via a second of the plurality of signal lines. The method also comprises generating a third value, based at least in part upon the second value, using the adjustable element, comparing the third value to the first value, and adjusting the adjustable element so as to modify the third value until the third value substantially matches the first value.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 1:
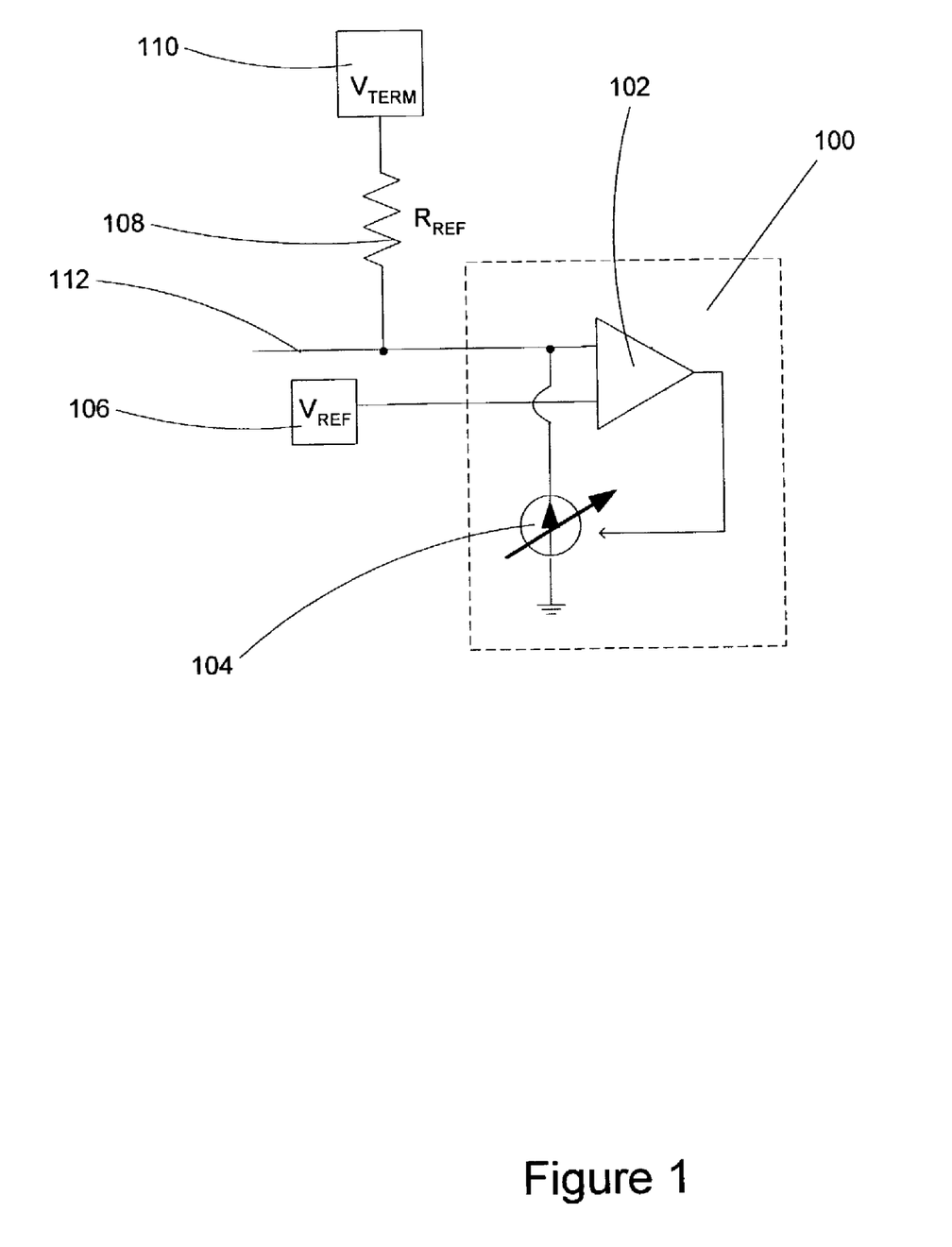
FIG. 1 shows a prior art system for calibrating a differential transmitter using dedicated external resources.

To assist in understanding the present invention, it is helpful to provide a brief overview of an existing calibration technique. Accordingly, referring to FIG. 1, there is shown a portion of a transmitter 100 having a comparator 102 and an adjustable current source 104, both of which are connected to a signal line 112. To calibrate the adjustable current source 104, which may, for example, be in the form of a transistor or resistor configuration or a combination thereof, an external voltage reference ($V_{REF}$) 106 is required. Also required is an external resistance reference ($R_{REF}$) 108 connected to an external power supply ($V_{TERM}$) 110 for providing a current path for the adjustable current source 104. The adjustable current source 104 is calibrated based upon a comparison performed by the comparator 102 of the voltage level on the signal line 112 and the voltage level of the external voltage reference ($V_{REF}$) 106. That is, the amount of current passing through the adjustable current source 104 is adjusted based upon feedback from the comparator 102, which indicates how closely the voltage level on the signal line 112 matches the voltage level of the external voltage reference ($V_{REF}$) 106. When the voltage level on the signal line 112 matches the voltage level of the external voltage reference ($V_{REF}$) 106, the adjustable current source 104 is considered calibrated.

As previously mentioned, the use of external resources for calibration purposes can impose large cost and complexity burdens on electronic devices and/or host systems. Thus, since the above-described existing calibration technique contains such external resources, another more cost effective method of calibration is desirable.

Figure 2:
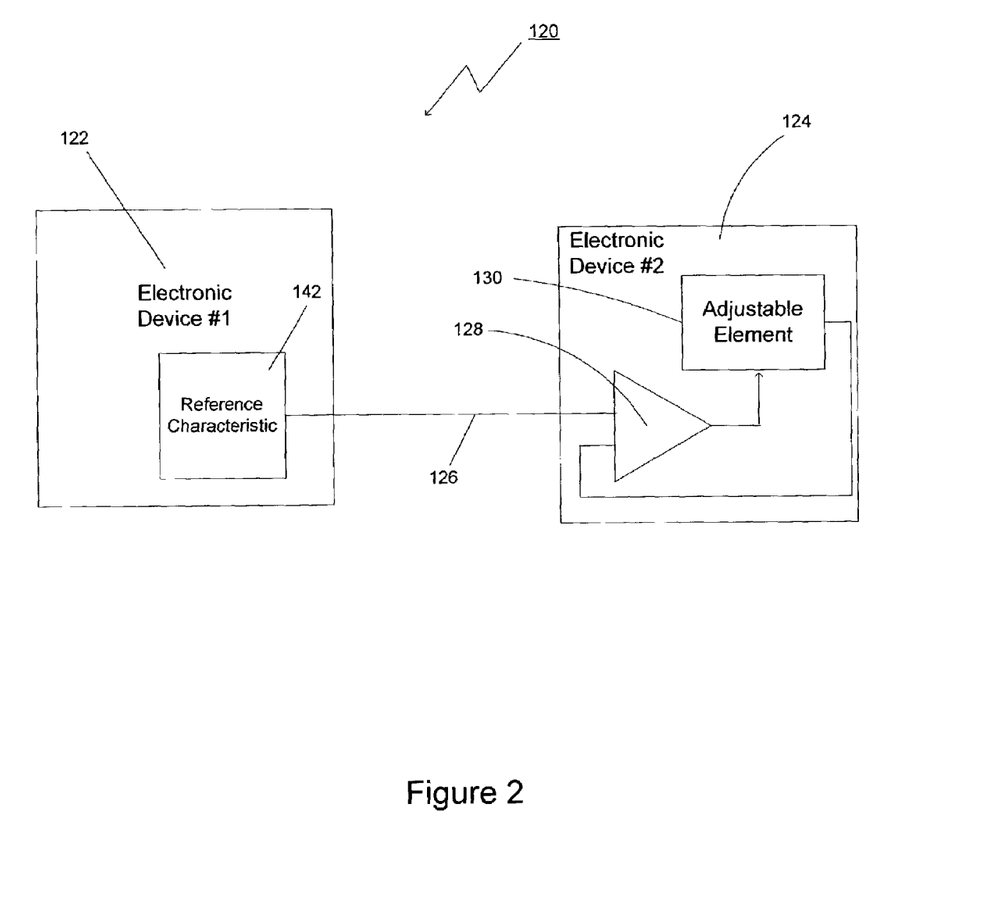
FIG. 2 shows a generalized calibration system in accordance with the present invention.

Referring to FIG. 2, there is shown an electronic system 120 which may be calibrated in accordance with the present invention. The electronic system 120 comprises a first electronic device 122 and a second electronic device 124 interconnected by a signal line 126. The first electronic device 122 and the second electronic device 124 may be any number of variations of electronic devices including, for example, random access memories, memory controllers, microprocessors, transmitters, receivers, and transceivers. For example, in accordance with one particular exemplary embodiment of the present invention, at least one of the first electronic device 122 and the second electronic device 124 may beneficially be a dynamic random access memory device, and at least one of the first electronic device 122 and the second electronic device 124 may beneficially be a memory controller device.

The signal line 126 is used for calibration purposes, as well as for typical interdevice communications. For example, the signal line 126 may communicate calibration signals between the first electronic device 122 and the second electronic device 124 for calibration purposes. The signal line 126 may also communicate, for example, address, control, and/or data signals between the first electronic device 122 and the second electronic device 124, wherein these signals are typically used for the processing and/or storage of information, and wherein these signals are not used for calibration purposes such as setting configuration or characterization parameters or measuring such or similar parameters. These typical interdevice communications typically take place after calibration of the electronic system 120.

The first electronic device 122 comprises a reference characteristic 142 for use in calibrating the second electronic device 124. For example, the reference characteristic 142 may comprise a reference voltage source, a reference current source, or a reference resistive element. As shown, the reference characteristic 142 is electrically connected to the signal line 126 within the first electronic device 122.

The second electronic device 124 comprises a comparator 128 and an adjustable element 130. The comparator 128 provides a control signal to the adjustable element 130 based upon a comparison between a reference value provided on the signal line 126 and a calibration value provided from the adjustable element 130. The adjustable element 130 may comprise an adjustable voltage source 132, an adjustable current source 134, an adjustable resistive element 138, or combinations thereof, as discussed below with reference to FIGS. 3, 4, and 5, respectively.

In operation, the first electronic device 122 is used to calibrate the second electronic device 124 using the reference characteristic 142 of the first electronic device 122. For example, referring to FIG. 3, wherein the adjustable element 130 comprises an adjustable voltage source 132, a reference value is provided to the second electronic device 124 on the signal line 126. This reference value is generated based at least in part upon the reference characteristic 142 the first electronic device 122. For example, if the reference characteristic 142 comprises a reference voltage source having a reference voltage value, this reference voltage value may be provided directly from the first electronic device 122 to the second electronic device 124 via the signal line 126.

Figure 3:
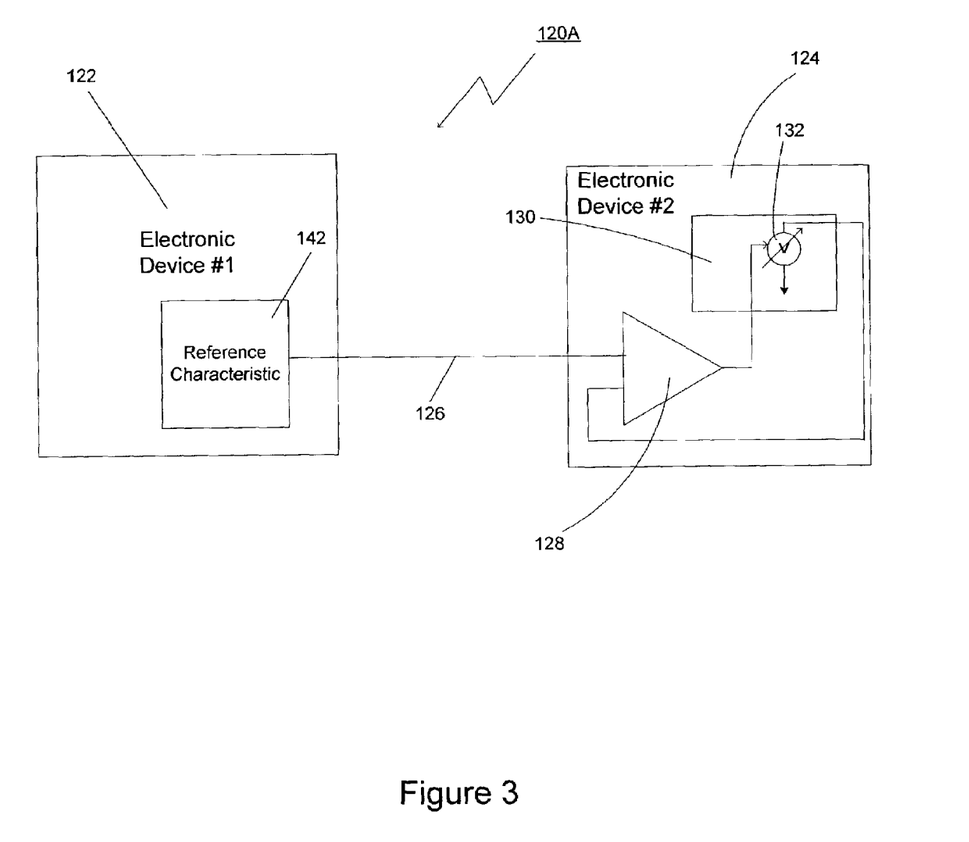
FIG. 3 shows a system for calibrating an adjustable voltage source in accordance with the present invention.

Alternatively, if the reference characteristic 142 comprises a reference current source having a reference current value, a reference voltage value may be derived or obtained using a reference current value and a resistive element (and applying Ohm's law). This resistive element may be located at the first electronic device 122, the second electronic device 124, or elsewhere so long as it is electrically connected to the signal line 126. The resulting reference voltage value may be provided to the second electronic device 124 via the signal line 126.

Alternatively still, if the reference characteristic 142 comprises a reference resistive element having a reference resistance value, a reference voltage value may be derived or obtained using the reference resistance value and a current source (and applying Ohm's law). This current source may be located at the first electronic device 122, the second electronic device 124, or elsewhere so long it is electrically connected to the signal line 126. The resulting reference voltage value may be provided to the second electronic device 124 via the signal line 126.

The adjustable voltage source 132 generates a calibration value based at least in part upon the reference voltage value. That is, the adjustable voltage source 132 generates an output voltage value (i.e., the calibration value) based upon a control signal from the comparator 128. This calibration value is fed back to the comparator 128. The comparator 128 generates the control signal based upon a comparison between the reference voltage value provided on the signal line 126 and the calibration value provided from the adjustable voltage source 132. Thus, the comparator 128 compares the calibration value to the reference voltage value and generates the control signal for adjusting the output voltage value (i.e., the calibration value) of the adjustable voltage source 132. The second electronic device 124 is considered calibrated when the output voltage value (i.e., the calibration value) of the adjustable voltage source 132 substantially matches the reference voltage value provided on the signal line 126.

Figure 4:
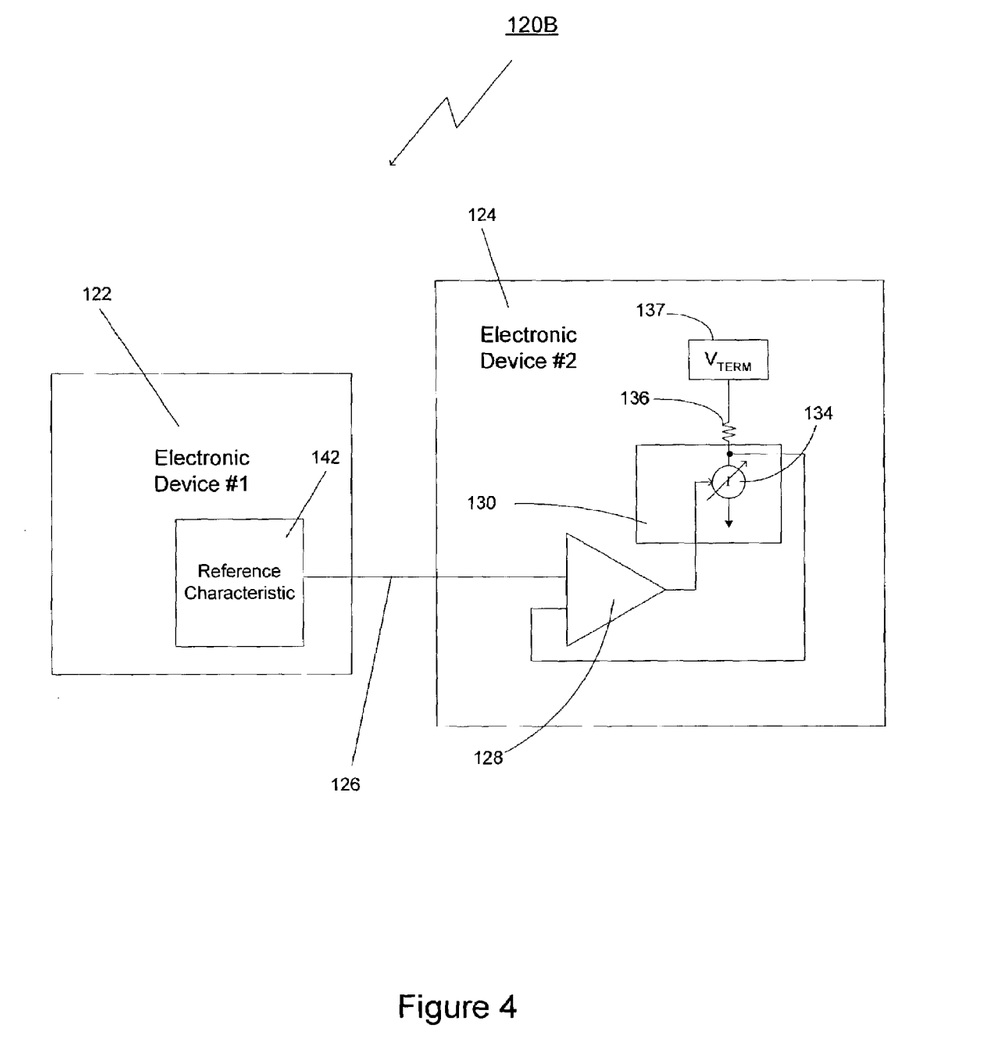
FIG. 4 shows a system for calibrating an adjustable current source in accordance with the present invention.

Referring to FIG. 4, wherein the adjustable element 130 comprises an adjustable current source 134, a reference voltage value is provided to the second electronic device 124 on the signal line 126 in a manner similar to that described above with reference to FIG. 3. The adjustable current source 134 then generates a calibration value based at least in part upon the reference voltage value. That is, the adjustable current source 134 generates an output current creating a voltage value (i.e., the calibration value) at an associated resistive element 136, which is connected to a terminal voltage connection 137, based upon a control signal from the comparator 128. This calibration value is fed back to the comparator 128. The comparator 128 generates the control signal based upon a comparison between the reference voltage value provided on the signal line 126 and the calibration value provided from the adjustable current source 134. Thus, the comparator 128 compares the calibration value to the reference voltage value and generates the control signal for adjusting the output current of the adjustable current source 134, thereby adjusting the created voltage value (i.e., the calibration value) at the resistive element 136. The second electronic device 124 is considered calibrated when the created voltage value (i.e., the calibration value) at the resistive element 136 substantially matches the reference voltage value provided on the signal line 126.

At this point it should be noted that the resistive element 136, which may be implemented, for example, in the form of a transistor or resistor configuration, or a combination thereof, preferably has a fixed resistance value when the calibration value is being generated. It should also be noted that, although it is preferred to have the resistive element 136 located at the second electronic device 124, the present invention is not limited in that regard. For example, the resistive element 136 may be located at the first electronic device 122, the second electronic device 124, or elsewhere within the system 120B. In any event, the resistive element 136 should be coupled in series with the adjustable current source 134 and the terminal voltage connection 137.

Figure 5:
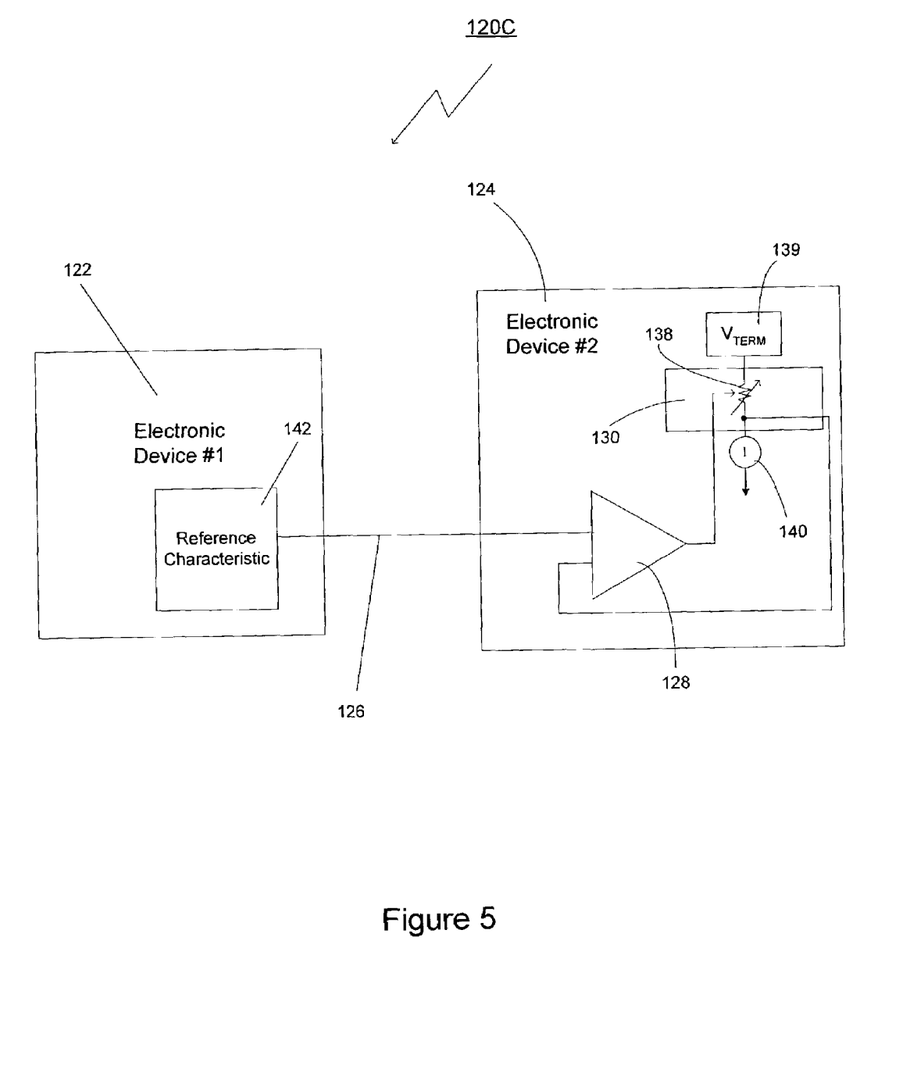
FIG. 5 shows a system for calibrating an adjustable resistive element in accordance with the present invention.

Referring to FIG. 5, wherein the adjustable element 130 comprises an adjustable resistive element 138, a reference voltage value is provided to the second electronic device 124 on the signal line 126 in a manner similar to that described above with reference to FIG. 3. The adjustable resistive element 138 then generates a calibration value based at least in part upon the reference voltage value. That is, the adjustable resistive element 138, which is connected to a terminal voltage connection 139, uses current from an associated current source 140 to generate a voltage value (i.e., the calibration value) based upon a control signal from the comparator 128. This calibration value is fed back to the comparator 128. The comparator 128 generates the control signal based upon a comparison between the reference voltage value provided on the signal line 126 and the calibration value provided from the adjustable resistive element 138. Thus, the comparator 128 compares the calibration value to the reference voltage value and generates the control signal for adjusting the resistance value of the adjustable resistive element 138, thereby adjusting the generated voltage value (i.e., the calibration value) at the adjustable resistive element 138. The second electronic device 124 is considered calibrated when the generated voltage value (i.e., the calibration value) at the adjustable resistive element 138 substantially matches the reference voltage value provided on the signal line 126.

At this point it should be noted that the current source 140, which may be implemented, for example, in the form of a transistor or resistor configuration, or a combination thereof, preferably has a fixed current value when the calibration value is being generated. It should also be noted that, although it is preferred to have the current source 140 located at the second electronic device 124, the present invention is not limited in that regard. For example, the current source 140 may be located at the first electronic device 122, the second electronic device 124, or elsewhere within the system 120C. In any event, the current source 140 should be coupled in series with the adjustable resistive element 138 and the terminal voltage connection 139.

At this point it should be noted that, although the above-described systems 120 only include a single reference characteristic in the first electronic device 122 and a single adjustable element in the second electronic device 124, it is within the scope of the present invention for the first electronic device 122 to have multiple reference characteristics and/or the second electronic device 124 to have multiple adjustable elements. The use and calibration of these multiple reference characteristics and multiple adjustable elements, respectively, follows directly from the above-described systems 120.

The present invention may be implemented in various types of signaling systems, including for example, differential signaling systems. One such embodiment, employing a differential signaling system, is described in FIG. 6, where there is shown a portion of a differential transmitter 200 in accordance with the present invention. The differential transmitter 200 comprises a mode controller 202, an adjustable current source 204, a first current switch 206, and a second current switch 208. As shown, the mode controller 202 may receive/transmit mode control information to/from the differential transmitter 200. Based upon this received/transmitted mode control information, the mode controller 202 controls the adjustable current source 204, the first current switch 206, and the second current switch 208. The overall operation of the differential transmitter 200 is described in more detail below.

Figure 7:
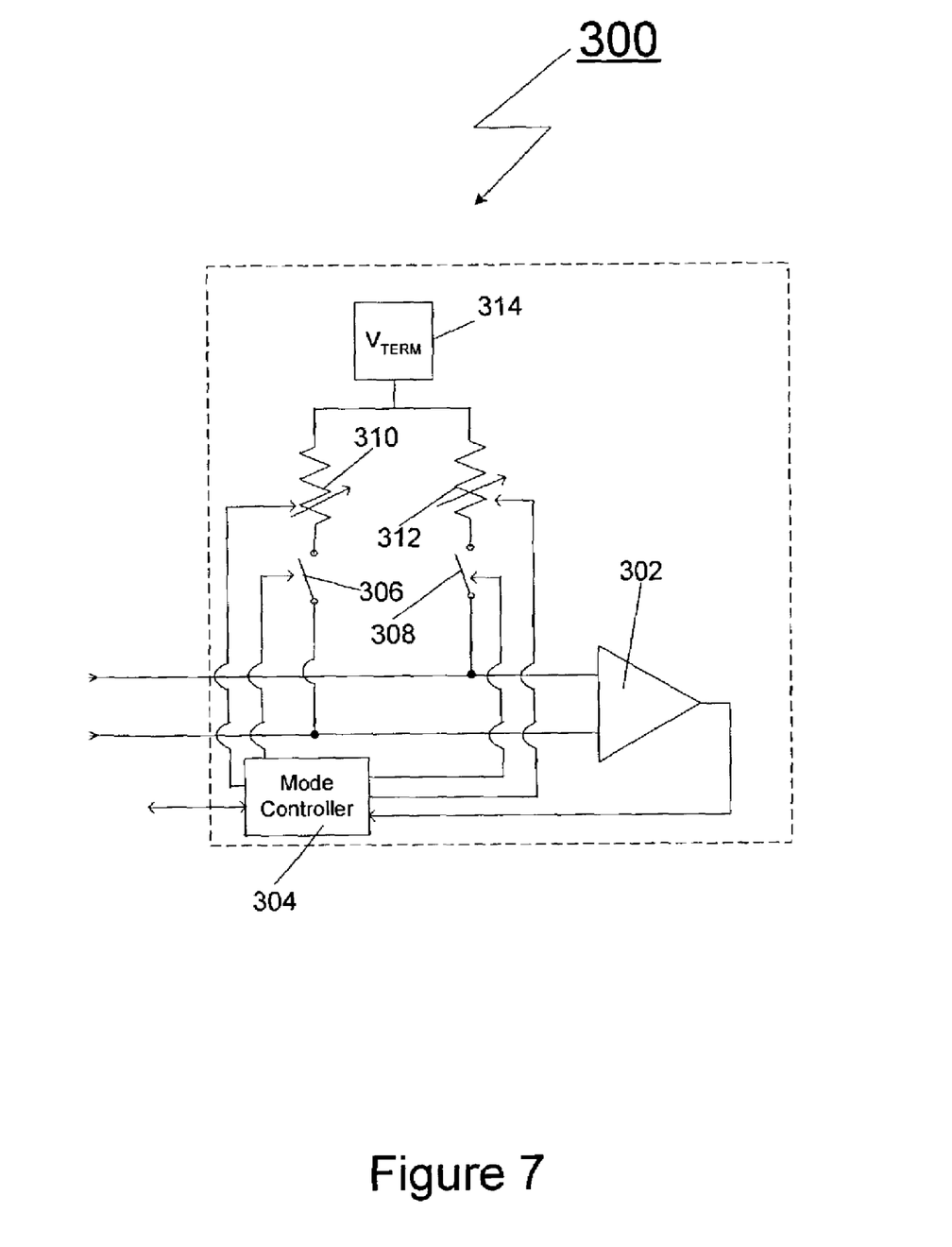
FIG. 7 shows a portion of a differential receiver in accordance with the present invention.

Referring to FIG. 7, there is shown a portion of a differential receiver 300 in accordance with the present invention. The differential receiver 300 comprises a comparator 302, a mode controller 304, a first current switch 306, a second current switch 308, a first adjustable resistive element 310, a second adjustable resistive element 312, and a terminal voltage connection 314. As shown, the mode controller 304 may receive/transmit mode control information to/from the differential receiver 300. As also shown, the mode controller 304 may receive feedback information from the comparator 302. Based upon this received/transmitted mode control information, and this received feedback information, the mode controller 304 controls the first current switch 306, the second current switch 308, the first adjustable resistive element 310, and the second adjustable resistive element 312. The overall operation of the differential receiver 300 is described in more detail below.

Figure 8:
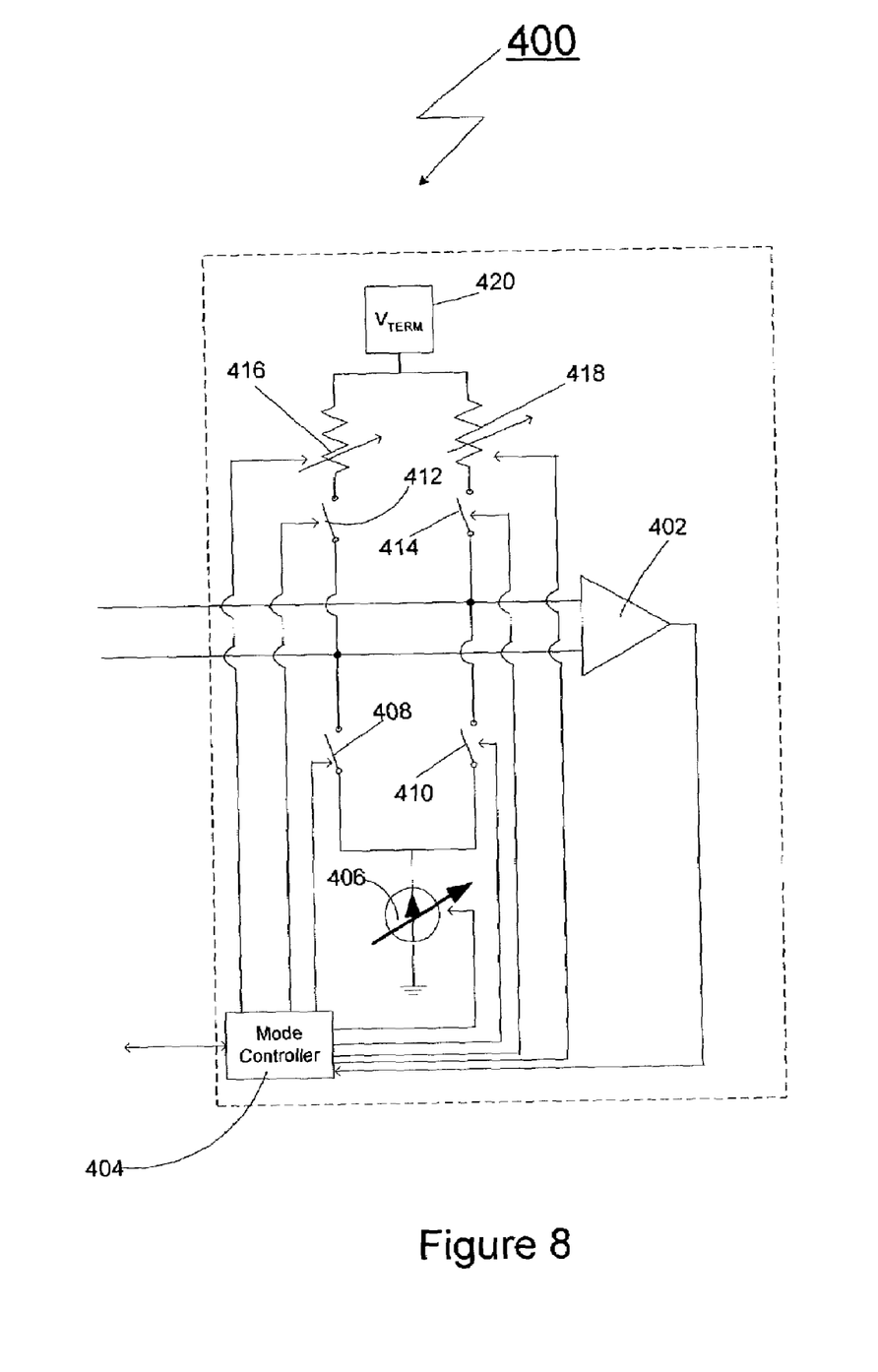
FIG. 8 shows a portion of a differential transceiver in accordance with the present invention.

Referring to FIG. 8, there is shown a portion of a differential transceiver 400 in accordance with the present invention. As shown, the differential transceiver 400 is a combination of the differential transmitter 200 and the differential receiver 300. That is, similar to the differential transmitter 200 and the differential receiver 300, the differential transceiver 400 comprises a comparator 402, a mode controller 404, an adjustable current source 406, a first current switch 408, a second current switch 410, a third current switch 412, a fourth current switch 414, a first adjustable resistive element 416, a second adjustable resistive element 418, and a terminal voltage connection 420. Thus, the operation of the differential transmitter 200 of FIG.

Figure 6:
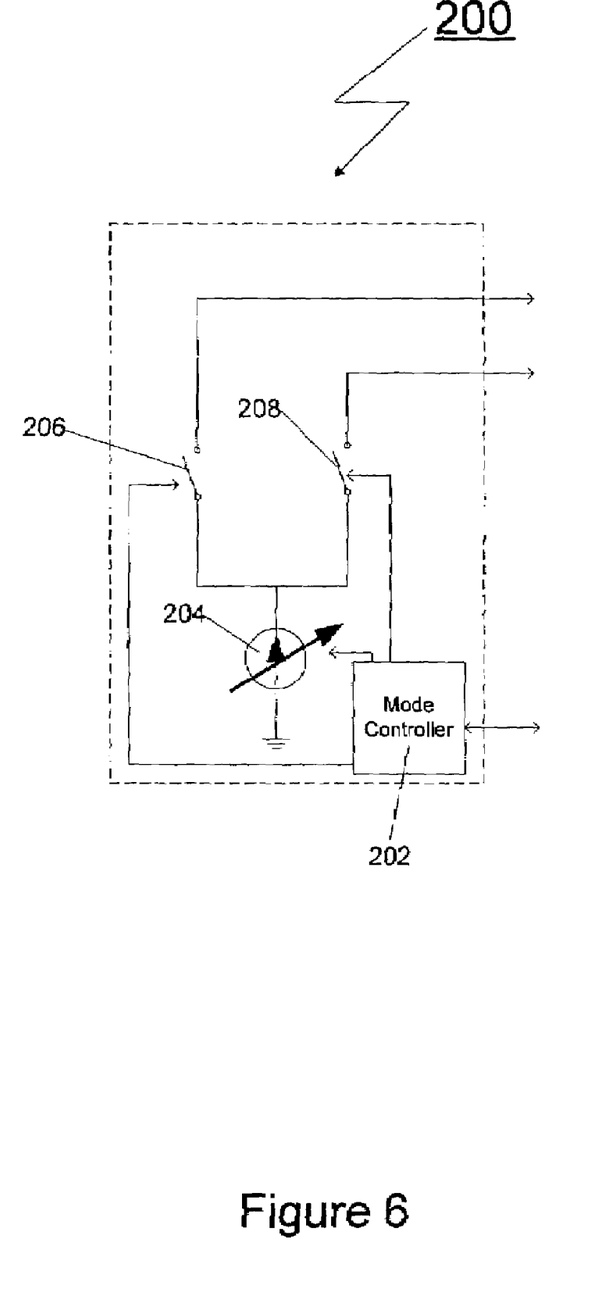
FIG. 6 shows a portion of a differential transmitter in accordance with the present invention.

6 and the differential receiver 300 of FIG. 7 may be described when describing the operation of the differential transceiver 400.

As shown, the mode controller 404 may receive/transmit mode control information to/from the differential transceiver 400. As also shown, the mode controller 404 may receive feedback information from the comparator 402. Based upon this received/transmitted mode control information, and this received feedback information, the mode controller 404 controls the adjustable current source 406, the first current switch 408, the second current switch 410, the third current switch 412, the fourth current switch 414, the first adjustable resistive element 416, and the second adjustable resistive element 418. The overall operation of the differential transceiver 400 is described in more detail below.

Figure 9:
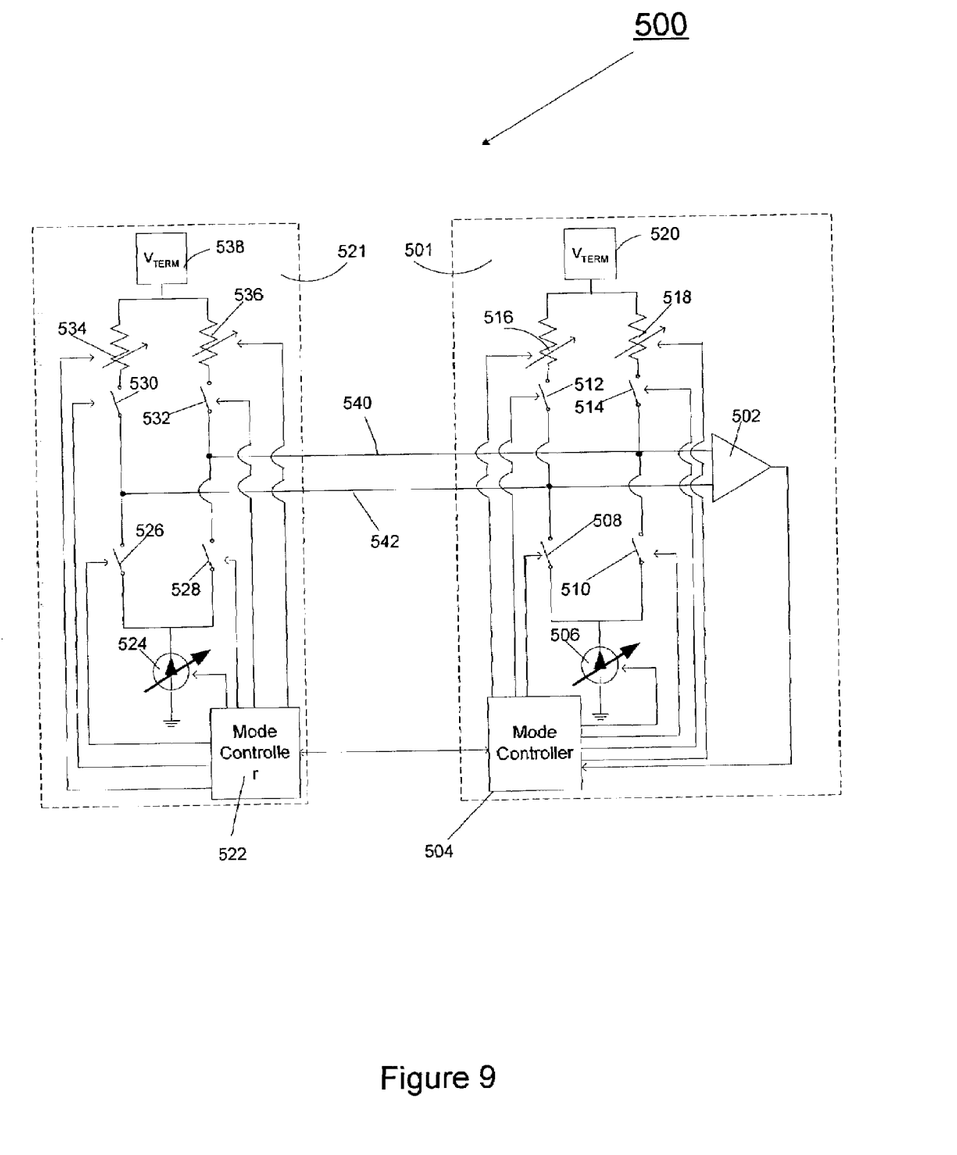
FIG. 9 shows a calibration system comprising a portion of a first differential transceiver to be calibrated and a portion of a second differential transceiver serving as a calibration reference device in accordance with the present invention.

Referring to FIG. 9, there is shown a calibration system 500 comprising a first differential transceiver 501 and a second differential transceiver 521, wherein the first differential transceiver 501 is to be calibrated and the second differential transceiver 521 serves as a calibration reference device in accordance with the present invention. The first differential transceiver 501 comprises a comparator 502, a mode controller 504, an adjustable current source 506, a first current switch 508, a second current switch 510, a third current switch 512, a fourth current switch 514, a first adjustable resistive element 516, a second adjustable resistive element 518, and a terminal voltage connection 520. The second differential transceiver 521 comprises a mode controller 522, an adjustable current source 524, a first current switch 526, a second current switch 528, a third current switch 530, a fourth current switch 532, a first adjustable resistive element 534, a second adjustable resistive element 536, and a terminal voltage connection 538. Thus, the first differential transceiver 501 and the second differential transceiver 521 have similar input/output structures. A first signal line 540 and a second signal line 542 connect the first differential transceiver 501 and the second differential transceiver 521.

At this point it should be noted that, although the second differential transceiver 521 is shown without a comparator (because a comparator is not required for calibration purposes in a calibration reference device), the second differential transceiver 521 may include a comparator.

As mentioned above, the second differential transceiver 521 serves as a calibration reference device. That is, it is assumed that the adjustable current source 524, the first adjustable resistive element 534, and the second adjustable resistive element 536 have all been previously adjusted to known and/or desired current and resistance values, respectively. These known and/or desired current and resistance values are used to calibrate the first differential transceiver 501.

The first differential transceiver 501 is actually calibrated by calibrating all three of the adjustable current source 506, the first adjustable resistive element 516, and the second adjustable resistive element 518. The adjustable current source 506 is calibrated based upon a comparison performed by the comparator 502 of the voltage level on the first signal line 540 and the voltage level on the second signal line 542. That is, the amount of current passing through the adjustable current source 506 is adjusted based upon feedback information from the comparator 502, which indicates how closely the voltage level on the first signal line 540 matches the voltage level on the second signal line 542. When the voltage level on the first signal line 540 matches the voltage level on the second signal line 542, the adjustable current source 506 is considered calibrated.

To accomplish the above-described calibration of the adjustable current source 506, the mode controller 504 in the first differential transceiver 501 communicates with the mode controller 504 in the second differential transceiver 521, and vice versa. That is, the mode controller 504 in the first differential transceiver 501 and the mode controller 522 in the second differential transceiver 521 communicate, either directly as shown in FIG. 9 or through some other controller device (not shown), so as to coordinate when the adjustable current source 506 will be calibrated, and then control their respective components accordingly. For example, when the mode controller 504 in the first differential transceiver 501 and the mode controller 522 in the second differential transceiver 521 coordinate the calibration of the adjustable current source 506, the mode controller 522 in the second differential transceiver 521 controls the state of the first current switch 526, the second current switch 528, the third current switch 530, and the fourth current switch 532 so that a reference voltage value is provided on the first signal line 540 and a current path is provided between the first differential transceiver 501 and the second differential transceiver 521 on the second signal line 542. That is, the mode controller 522 in the second differential transceiver 521 controls the first current switch 526 to be in an open state, the second current switch 528 to be in a closed open state, the third current switch 530 to be in a closed state, and the fourth current switch 532 to be in a closed state. Thus, since the adjustable current source 524 and the second adjustable resistive element 536 have both been previously adjusted to known and/or desired current and resistance values, respectively, a known and/or desired reference voltage value may be provided on the first signal line 540. Also, since the first current switch 526 is in an open state and the third current switch 530 is in a closed state, a current path between the first differential transceiver 501 and the second differential transceiver 521 may be provided on the second signal line 542.

At the same time that the mode controller 522 in the second differential transceiver 521 is controlling the state of the switches in the second differential transceiver 521, the mode controller 504 in the first differential transceiver 501 is controlling the state of the switches in the first differential transceiver 501. That is, the mode controller 504 in the first differential transceiver 501 controls the state of the first current switch 508, the second current switch 510, the third current switch 512, and the fourth current switch 514 so that the reference voltage value provided by the second differential transceiver 521 on the first signal line 540 may be utilized by the comparator 502 in the first differential transceiver 501 and the current path between the first differential transceiver 501 and the second differential transceiver 521 on the second signal line 542 may be routed through the adjustable current source 506 in the first differential transceiver 501. That is, the mode controller 504 in the first differential transceiver 501 controls the first current switch 508 to be in a closed state, the second current switch 510 to be in an open state, the third current switch 512 to be in an open state, and the fourth current switch 514 to be in an open state. Thus, the reference voltage value provided by the second differential transceiver 521 on the first signal line 540 can be utilized by the comparator 502 in the first differential transceiver 501. Also, since the first current switch 508 is in a closed state, the second current switch 510 is in an open state, the third current switch 512 is in an open state, and the fourth current switch 514 is in an open state, the current path between the first differential transceiver 501 and the second differential transceiver 521 on the second signal line 542 may be routed through the adjustable current source 506 in the first differential transceiver 501.

Since the adjustable current source 524, the first adjustable resistive element 534, and the second adjustable resistive element 536 in the second differential transceiver 521 has been previously adjusted to known and/or desired current and resistance values, respectively, the adjustable current source 506 in the first differential transceiver 501 may be calibrated by adjusting the amount of current passing therethrough based upon feedback information from the comparator 502, which indicates how closely the voltage level on the first signal line 540 matches the voltage level on the second signal line 542. That is, the adjustable current source 506 in the first differential transceiver 501 may be calibrated by adjusting the amount of current passing therethrough until the reference voltage value provided by the second differential transceiver 521 on the first signal line 540 matches the voltage level produced by the current path between the first differential transceiver 501 and the second differential transceiver 521 on the second signal line 542. Thus, when the voltage level on the first signal line 540 matches the voltage level on the second signal line 542, the adjustable current source 506 is considered calibrated.

Once the adjustable current source 506 is calibrated, the first adjustable resistive element 516 and the second adjustable resistive element 518 may be calibrated. Similar to the adjustable current source 506, the first adjustable resistive element 516 is calibrated based upon a comparison performed by the comparator 502 of the voltage level on the first signal line 540 and the voltage level on the second signal line 542. That is, the resistance value of the first adjustable resistive element 516 is adjusted based upon feedback information from the comparator 502, which indicates how closely the voltage level on the first signal line 540 matches the voltage level on the second signal line 542. When the voltage level on the first signal line 540 matches the voltage level on the second signal line 542, the first adjustable resistive element 516 is considered calibrated.

To accomplish the above-described calibration of the first adjustable resistive element 516, the mode controller 504 in the first differential transceiver 501 again communicates with the mode controller 504 in the second differential transceiver 521, and vice versa. That is, the mode controller 504 in the first differential transceiver 501 and the mode controller 522 in the second differential transceiver 521 communicate so as to coordinate when the first adjustable resistive element 516 will be calibrated, and then control their respective components accordingly. For example, when the mode controller 504 in the first differential transceiver 501 and the mode controller 522 in the second differential transceiver 521 coordinate the calibration of the first adjustable resistive element 516, the mode controller 522 in the second differential transceiver 521 controls the state of the first current switch 526, the second current switch 528, the third current switch 530, and the fourth current switch 532 so that a reference voltage value is provided on the first signal line 540 and a current path is provided between the first differential transceiver 501 and the second differential transceiver 521 on the second signal line 542. That is, the mode controller 522 in the second differential transceiver 521 controls the first current switch 526 to be in a closed state, the second current switch 528 to be in a closed state, the third current switch 530 to be in an open state, and the fourth current switch 532 to be in a closed state. Thus, since the adjustable current source 524 and the second adjustable resistive element 536 have both been previously adjusted to known and/or desired current and resistance values, respectively, a known and/or desired reference voltage value may be provided on the first signal line 540. Also, since the first current switch 526 is in a closed state and the third current switch 534 is in an open state, a current path between the first differential transceiver 501 and the second differential transceiver 521 may be provided on the second signal line 542.

At the same time that the mode controller 522 in the second differential transceiver 521 is controlling the state of the switches in the second differential transceiver 521, the mode controller 504 in the first differential transceiver 501 is controlling the state of the switches in the first differential transceiver 501. That is, the mode controller 504 in the first differential transceiver 501 controls the state of the first current switch 508, the second current switch 510, the third current switch 512, and the fourth current switch 514 so that the reference voltage value provided by the second differential transceiver 521 on the first signal line 540 may be utilized by the comparator 502 in the first differential transceiver 501 and the current path between the first differential transceiver 501 and the second differential transceiver 521 on the second signal line 542 may be routed through the first adjustable resistive element 516. That is, the mode controller 504 in the first differential transceiver 501 controls the first current switch 508 to be in an open state, the second current switch 510 to be in an open state, the third current switch 512 to be in a closed state, and the fourth current switch 514 to be in an open state. Thus, the reference voltage value provided by the second differential transceiver 521 on the first signal line 540 can be utilized by the comparator 502 in the first differential transceiver 501. Also, since the first current switch 508 is in an open state and the third current switch 512 is in a closed state, the current path between the first differential transceiver 501 and the second differential transceiver 521 on the second signal line 542 may be routed through the first adjustable resistive element 516.

Since the adjustable current source 524 and the second adjustable resistive element 536 in the second differential transceiver 521 has been previously adjusted to known and/or desired current and resistance values, respectively, the first adjustable resistive element 516 in the first differential transceiver 501 may be calibrated by adjusting its resistance value based upon feedback information from the comparator 502, which indicates how closely the voltage level on the first signal line 540 matches the voltage level on the second signal line 542. That is, the first adjustable resistive element 516 in the first differential transceiver 501 may be calibrated by adjusting its resistance value until the reference voltage value provided by the second differential transceiver 521 on the first signal line 540 matches the voltage level produced by the current path between the first differential transceiver 501 and the second differential transceiver 521 on the second signal line 542. Thus, when the voltage level on the first signal line 540 matches the voltage level on the second signal line 542, the first adjustable resistive element 516 is considered calibrated.

The first adjustable resistive element 516 may also be calibrated in an alternative manner. Similar to above, the first adjustable resistive element 516 is calibrated based upon a comparison performed by the comparator 502 of the voltage level on the first signal line 540 and the voltage level on the second signal line 542. That is, the resistance value of the first adjustable resistive element 516 is adjusted based upon feedback information from the comparator 502, which indicates how closely the voltage level on the first signal line 540 matches the voltage level on the second signal line 542. When the voltage level on the first signal line 540 matches the voltage level on the second signal line 542, the first adjustable resistive element 516 is considered calibrated.

To accomplish the above-described alternative calibration of the first adjustable resistive element 516, the mode controller 504 in the first differential transceiver 501 again communicates with the mode controller 504 in the second differential transceiver 521, and vice versa. That is, the mode controller 504 in the first differential transceiver 501 and the mode controller 522 in the second differential transceiver 521 communicate so as to coordinate when the first adjustable resistive element 516 will be calibrated, and then control their respective components accordingly. For example, when the mode controller 504 in the first differential transceiver 501 and the mode controller 522 in the second differential transceiver 521 coordinate the calibration of the first adjustable resistive element 516, the mode controller 522 in the second differential transceiver 521 controls the state of the first current switch 526, the second current switch 528, the third current switch 530, and the fourth current switch 532 only so that a reference voltage value is provided on the first signal line 540. That is, the mode controller 522 in the second differential transceiver 521 controls the first current switch 526 to be in an open state, the second current switch 528 to be in a closed state, the third current switch 530 to be in an open state, and the fourth current switch 532 to be in a closed state. Thus, since the adjustable current source 524 and the second adjustable resistive element 536 have both been previously adjusted to known and/or desired current and resistance values, respectively, a known and/or desired reference voltage value may be provided on the first signal line 540.

At the same time that the mode controller 522 in the second differential transceiver 521 is controlling the state of the switches in the second differential transceiver 521, the mode controller 504 in the first differential transceiver 501 is controlling the state of the switches in the first differential transceiver 501. That is, the mode controller 504 in the first differential transceiver 501 controls the state of the first current switch 508, the second current switch 510, the third current switch 512, and the fourth current switch 514 so that the reference voltage value provided by the second differential transceiver 521 on the first signal line 540 may be utilized by the comparator 502 in the first differential transceiver 501 and a current path may be routed through the first adjustable resistive element 516. That is, the mode controller 504 in the first differential transceiver 501 controls the first current switch 508 to be in a closed state, the second current switch 510 to be in an open state, the third current switch 512 to be in a closed state, and the fourth current switch 514 to be in an open state. Thus, the reference voltage value provided by the second differential transceiver 521 on the first signal line 540 can be utilized by the comparator 502 in the first differential transceiver 501. Also, since the first current switch 508 is in a closed state and the third current switch 512 is in a closed state, a current path may be routed through the first adjustable resistive element 516.

Since the adjustable current source 506 in the first differential transceiver 501 has been previously adjusted to a known and/or desired current value, the first adjustable resistive element 516 in the first differential transceiver 501 may be calibrated by adjusting its resistance value based upon feedback information from the comparator 502, which indicates how closely the voltage level on the first signal line 540 matches the voltage level on the second signal line 542. That is, the first adjustable resistive element 516 in the first differential transceiver 501 may be calibrated by adjusting its resistance value until the reference voltage value provided by the second differential transceiver 521 on the first signal line 540 matches the voltage level on the second signal line 542 produced by the current path routed through the first adjustable resistive element 516. Thus, when the voltage level on the first signal line 540 matches the voltage level on the second signal line 542, the first adjustable resistive element 516 is considered calibrated.

The second adjustable resistive element 518 in the first differential transceiver 501 may be calibrated in a manner similar to the calibration techniques for the first adjustable resistive element 516 as described above.

The present invention calibration techniques may be used in point-to-point signal line topology environments, wherein one device that is connected to the signal line needs to be calibrated and another device that is connected to the signal line has been previously calibrated and serves as a calibration reference device. The present invention calibration techniques may also be used in bussed signal line topology environments, wherein at least one device that is connected to the bussed signal line needs to be calibrated and at least one other device that is connected to the bussed signal line has been previously calibrated and serves as a calibration reference device. The present invention calibration techniques may further be used in daisy-chained signal line topology environments, wherein a first device that is connected to the daisy-chained signal line is previously calibrated and serves as a first calibration reference device and wherein successive devices that are connected to the daisy-chained signal line are calibrated using the necessary references from respective just prior calibrated devices.

At this point it should be noted that the present invention is also applicable to devices and systems that utilize various signaling systems, including, for example, single-ended signaling, differential signaling and multilevel signaling. Although some such implementations are described in detailed, in the interest of clarity not all features of all such implementations are described herein. It will be appreciated that in the development of any such specific implementation, many implementation-specific decisions will need to be made to achieve the designer's specific goals, such as compliance with system and/or business needs. Moreover, it will be appreciated that such a development effort might be complex and time-consuming but would nevertheless be a routine undertaking for those of ordinary skill in the art having the benefit of this disclosure.

At this point it should be noted that the calibration techniques in accordance with the present invention as described above may involve the processing of input data and the generation of output data to some extent. This input data processing and output data generation may be implemented in hardware or software. For example, specific electronic components may be employed in a transceiver or similar or related circuitry for implementing the functions associated with the calibration techniques in accordance with the present invention as described above. Alternatively, one or more processors operating in accordance with stored instructions may implement the functions associated the calibration techniques in accordance with the present invention as described above. If such is the case, it is within the scope of the present invention that such instructions may be stored on one or more processor readable media, or transmitted to one or more processors via one or more signals.

In summary, the present invention discloses calibration techniques wherein known values of V, I, and/or R are provided from a previously calibrated device to one or more uncalibrated devices across existing system interconnects.

This invention is particularly applicable to high-speed system interconnects and/or systems having large numbers of electronic devices.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for calibrating a second electronic device using a first electronic device, the first electronic device having a first reference characteristic and a second reference characteristic, the second electronic device having a first adjustable element and a second adjustable element, the first electronic device and the second electronic device being interconnected via one or more signal lines, the method comprising the steps of:
   generating a first value based at least in part upon the first reference characteristic;
   providing the first value to the second electronic device via one of the one or more signal lines;
   generating a second value, based at least in part on the first value, using the first adjustable element;
   comparing the second value to the first value;
   adjusting the first adjustable element so as to modify the second value until the second value substantially matches the first value and thus the second electronic device is calibrated using the first electronic device;
   generating a third value based at least in part upon the second reference characteristic;
   providing the third value to the second electronic device via a second one of the one or more signal lines;
   generating a fourth value, based at least in part upon the third value, using the second adjustable element;
   comparing the fourth value to the third value; and
   adjusting the second adjustable element so as to modify the fourth value until the fourth value substantially matches the third value.

2. The method as defined in claim 1, wherein at least one of the first electronic device and the second electronic device is a dynamic random access memory device.

3. The method as defined in claim 2, wherein at least one of the first electronic device and the second electronic device is a memory controller device.

4. The method as defined in claim 1, wherein the first reference characteristic is a reference voltage source, wherein the first value is a reference voltage value, and wherein the second value is a calibration voltage value.

5. The method as defined in claim 4, wherein the first adjustable element comprises an adjustable voltage source.

6. The method as defined in claim 4, further comprising the step of:
   providing a resistive element, wherein the first adjustable element comprises an adjustable current source coupled to the resistive element.

7. The method as defined in claim 6, wherein the resistive element has a resistance value which is fixed when generating the second value.

8. The method as defined in claim 4, further comprising the step of:
   providing a current source, wherein the first adjustable element comprises an adjustable resistive element coupled to the current source.

9. The method as defined in claim 8, wherein the current source has a current value which is fixed when generating the second value.

10. The method as defined in claim 1, wherein the first reference characteristic is a reference current source having a reference current value, wherein the first value is a reference voltage value, wherein the second value is a calibration voltage value, and wherein the step of generating a first value comprises the step of:
    generating the reference voltage value by passing a current associated with the reference current value through a resistive element.

11. The method as defined in claim 10, wherein the resistive element is located at one of the first electronic device, the second electronic device, and the signal line.

12. The method as defined in claim 10, wherein the resistive element has a resistance value which is fixed when generating the second value.

13. The method as defined in claim 10, wherein the first adjustable element comprises an adjustable voltage source.

14. The method as defined in claim 10, further comprising the step of:
    providing a resistive element, wherein the first adjustable element comprises an adjustable current source coupled to the resistive element.

15. The method as defined in claim 14, wherein the resistive element has a resistance value which is fixed when generating the second value.

16. The method as defined in claim 10, further comprising the step of:
    providing a current source, wherein the first adjustable element comprises an adjustable resistive element coupled to the current source.

17. The method as defined in claim 16, wherein the current source has a current value which is fixed when generating the second value.

18. The method as defined in claim 1, wherein the first reference characteristic is a reference resistive element having a reference resistance value, wherein the first value is a reference voltage value, wherein the second value is a calibration voltage value, and wherein the step of generating a first value comprises the step of:
    generating the reference voltage value by passing a current associated with a current source through the reference resistive element.

19. The method as defined in claim 18, wherein the current source is located at one of the first electronic device, the second electronic device, and the signal line.

20. The method as defined in claim 19, wherein the current source has a current value which is fixed when generating the second value.

21. The method as defined in claim 18, wherein the first adjustable element comprises an adjustable voltage source.

22. The method as defined in claim 18, further comprising the step of:
    providing a resistive element, wherein the first adjustable element comprises an adjustable current source coupled to the resistive element.

23. The method as defined in claim 22, wherein the resistive element has a resistance value which is fixed when generating the second value.

24. The method as defined in claim 18, further comprising the step of:

provided a current source, wherein the first adjustable element comprises an adjustable resistive element coupled to the current source.

25. The method as defined in claim 24, wherein the current source has a current value which is fixed when generating the second value.

26. The method as defined in claim 1, wherein the step of providing the first value to the second electronic device via one of the one or more signal lines comprises the step of:

transmitting the first value from the first electronic device to the second electronic device via one of the one or more signal lines.

27. The method as defined in claim 1, wherein the one or more signal lines carry digital signals between the first electronic device and the second electronic device after the second electronic device is calibrated.

28. The method as defined in claim 1, wherein the one or more signal lines include one or more intersystem communication signal lines.

29. The method as defined in claim 1, wherein the one or more signal lines include one or more interdevice communication signal lines.

30. The method as defined in claim 1, wherein the first electronic device and the second electronic device have similar input/output structures which are interconnected via at least one of the one or more signal lines.

* * * * *